(12) United States Patent
Basu et al.

(10) Patent No.: US 9,287,360 B1
(45) Date of Patent: Mar. 15, 2016

(54) III-V NANOWIRE FET WITH COMPOSITIONALLY-GRADED CHANNEL AND WIDE-BANDGAP CORE

(71) Applicant: International Business Machines Corporation, Armonk, NY (US)

(72) Inventors: Anirban Basu, Lagrangeville, NY (US); Guy M. Cohen, Ossining, NY (US); Amlan Majumdar, White Plains, NY (US); Jeffrey W. Sleight, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/591,018

(22) Filed: Jan. 7, 2015

(51) Int. Cl.
| | |
|---|---|
| *H01L 29/772* | (2006.01) |
| *H01L 29/06* | (2006.01) |
| *H01L 29/66* | (2006.01) |
| *H01L 29/775* | (2006.01) |
| *H01L 29/423* | (2006.01) |
| *H01L 29/20* | (2006.01) |
| *H01L 29/08* | (2006.01) |
| *H01L 21/285* | (2006.01) |

(52) U.S. Cl.
CPC ...... *H01L 29/0673* (2013.01); *H01L 21/28556* (2013.01); *H01L 29/0649* (2013.01); *H01L 29/0847* (2013.01); *H01L 29/20* (2013.01); *H01L 29/42392* (2013.01); *H01L 29/66439* (2013.01); *H01L 29/775* (2013.01)

(58) Field of Classification Search
CPC . H01L 29/0673; H01L 29/0847; H01L 29/20; H01L 29/42392; H01L 29/66439; H01L 29/775
See application file for complete search history.

(56) References Cited

U.S. PATENT DOCUMENTS

| | | | |
|---|---|---|---|
| 4,460,910 A | 7/1984 | Chappell et al. | |
| 5,712,501 A | 1/1998 | Davies et al. | |
| 6,744,083 B2 | 6/2004 | Chen et al. | |
| 8,017,933 B2 | 9/2011 | Pillarisetty et al. | |
| 8,384,065 B2* | 2/2013 | Bangsaruntip | B82Y 10/00 257/24 |
| 8,610,207 B2 | 12/2013 | Bulucea | |
| 9,123,567 B2* | 9/2015 | Radosavljevic | H01L 21/823807 |
| 2009/0057762 A1* | 3/2009 | Bangsaruntip | B82Y 10/00 257/347 |
| 2010/0295022 A1* | 11/2010 | Chang | B82Y 10/00 257/24 |
| 2011/0133162 A1* | 6/2011 | Bangsaruntip | B82Y 10/00 257/24 |
| 2014/0034908 A1* | 2/2014 | Bangsaruntip | H01L 29/775 257/27 |
| 2014/0175515 A1* | 6/2014 | Then | H01L 29/772 257/194 |
| 2014/0183451 A1* | 7/2014 | Hirai | H01L 29/66439 257/24 |
| 2014/0209864 A1* | 7/2014 | Bangsaruntip | H01L 21/77 257/29 |

* cited by examiner

*Primary Examiner* — Allan R Wilson
(74) *Attorney, Agent, or Firm* — Alexa L. Ashworth

(57) ABSTRACT

A method for fabricating a III-V nanowire. The method may include providing a semiconductor substrate, which includes an insulator, with a wide-bandgap layer on the top surface of the semiconductor substrate; etching the insulator to suspend the wide-bandgap layer; growing a compositionally-graded channel shell over the wide-bandgap layer; forming a gate structure forming spacers on the sidewalls of the gate structure; and forming a doped raised source drain region adjacent to the spacers.

11 Claims, 10 Drawing Sheets

ID-V NANOWIRE FET WITH
COMPOSITIONALLY-GRADED CHANNEL
AND WIDE-BANDGAP CORE

BACKGROUND OF THE INVENTION

The present invention relates generally to semiconductor devices, and more particularly to III-V nanowire FETs with a compositionally-graded channel shell around a wide-bandgap core and methods of their fabrication.

The fabrication of semiconductor devices involves forming electronic components in and on semiconductor substrates, such as silicon wafers. These electronic components may include one or more conductive layers, one or more insulation layers, and doped regions formed by adding various dopants into portions of a semiconductor substrate to achieve specific electrical properties. Semiconductor devices include transistors, diodes, resistors, capacitors, and the like, with intermediate and overlying metallization patterns at varying levels, separated by dielectric materials, which interconnect the semiconductor devices to form integrated circuits.

Field-effect transistors (FETs) are a commonly used semiconductor device. Generally, a FET has three terminals, i.e., a gate structure or gate stack to control the charge in a channel region, a source region, and a drain region. The gate stack is a structure used to control output current, i.e., flow of carriers in the channel portion of an FET, through electrical fields. The channel portion of the substrate is the region between the source region and the drain region of a semiconductor device that becomes conductive when certain voltage is applied to the gate. The source region is a doped region in the semiconductor device from which majority carriers are flowing into the channel portion. The drain region is a doped region in the semiconductor device located at the end of the channel portion, in which carriers are flowing into from the source region via the channel portion and out of the semiconductor device through the drain region.

In nanowire FETs with uniform channel material, the charge centroid and the maximum leaking point in the sub-threshold regime is the center of the nanowire. In materials with substantial conduction band offset, if the center region or core of the nanowire has a wider bandgap material, and/or the nanowire channel has compositional grading, then the charge of the centroid and the maximum leakage point will move to the outer channel region and become closer to the gate. This often leads to improved gate control over the nanowire channel in the sub-threshold regime and better control of short-channel effects. The use of wider bandgap material in the inner region of the nanowire also often reduces off-state leakage due to tunneling (i.e., direct source-to-drain tunneling and band-to-band tunneling). However, some nanowire FETs material systems have a conduction band offset that is zero, or close to zero, making it difficult to improve gate control and short-channel effects.

SUMMARY

According to one embodiment of the present invention, a method for fabricating a III-V nanowire is provided, the method comprising: providing a semiconductor substrate comprising an insulator, wherein a wide-bandgap layer is disposed on a top surface of the semiconductor substrate; etching the insulator to suspend the wide-bandgap layer; growing a compositionally-graded channel shell over the wide-bandgap layer; forming a gate structure and spacers, wherein the spacers are formed on sidewalls of the gate structure; and forming a doped raised source drain region adjacent to the spacers.

According to another embodiment of the present invention, a semiconductor structure is provided, the semiconductor structure comprising: a wide-bandgap layer disposed on a semiconductor substrate; a nanowire FET disposed above said semiconductor substrate, wherein said nanowire FET comprises a compositionally-graded channel shell; a gate structure, such that a portion of the gate structure is disposed on said nanowire FET, wherein spacers are formed on sidewalls of the gate structure; and a doped III-V raised source drain region around said compositionally-graded channel shell, wherein a doped III-V raised source drain is configured to facilitate conductivity in the doped III-V raised source drain region.

DETAILED DESCRIPTION

Figure 1A:
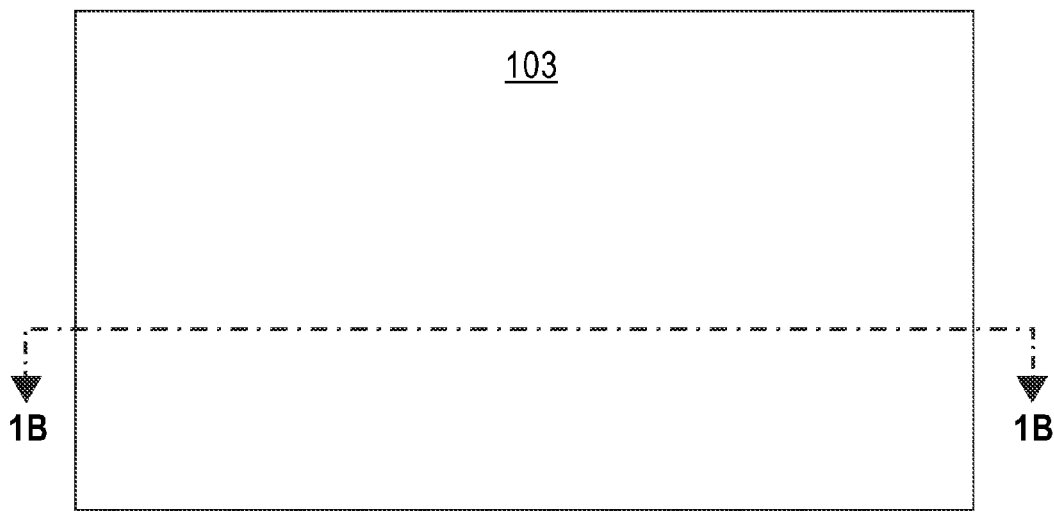
FIGS. 1A and 1B depict a plan view and a cross-sectional view of a semiconductor starting wafer, in accordance with an embodiment of the present invention.

Embodiments of the present invention describe III-V nanowire FETs with compositionally-graded channel shells and wide-bandgap cores. Detailed description of embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale; some features may be exaggerated to show details of particular components. Therefore, specific structural and functional details disclosed herein are not to be interpreted as limiting, but merely as a representative basis for teaching one skilled in the art to variously employ the methods and structures of the present disclosure.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing Figures. The terms "on", "over", "overlying", "atop", "positioned on", or "positioned atop" mean that a first element, such as a first structure, is present on a second element, such as a second structure, wherein intervening elements, such as an interface structure, may be present between the first element and the second element. The terms "direct contact", "directly on", or "directly over" mean that a first element, such as a first structure, and a second element, such as a second structure, are connected without any intermediary conducting, insulating or semiconductor layers at the interface of the two elements. The terms "connected" or "coupled" mean that one element is directly connected or coupled to another element, or intervening elements may be present. The terms "directly connected" or "directly coupled" mean that one element is connected or coupled to another element without any intermediary elements present.

Sequential steps of an exemplary embodiment of a method for fabrication of a III-V nanowire FET with a compositionally-graded channel shell and a wide-bandgap core are described below with respect to FIGS. 1-8.

Figure 1B:
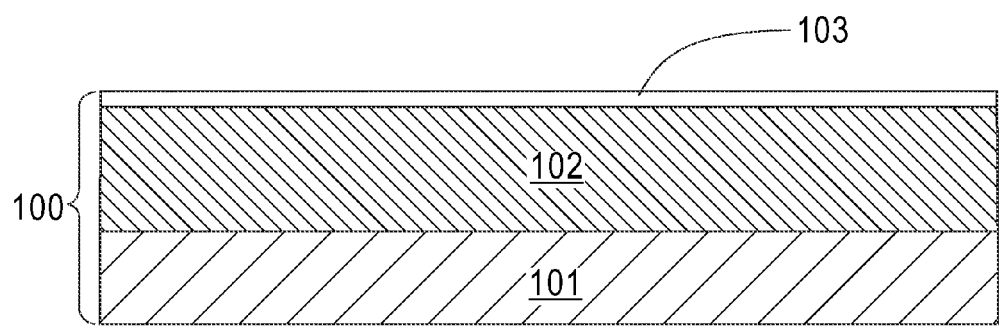

Referring now to the figures, FIG. 1A depicts a plan view of a semiconductor starting wafer 100 upon which embodiments of the present invention may be fabricated, and FIG. 1B depicts a cross-sectional view of FIG. 1A, taken along the line 1B-1B of FIG. 1A. In this exemplary embodiment, starting wafer 100 includes substrate 101, buried oxide (BOX) 102 and wide-band-gap III-V semiconductor 103. A person of skill in the art will recognize that starting wafer 100 can be composed of any standard starting material used in the art. In an example, if starting wafer 100 is used for making a semiconductor device, then starting wafer 100 is a single-crystal semiconductor wafer. In this exemplary embodiment, substrate 101 is composed of a silicon containing material, such as Si, single crystal Si, SiGe, single crystal silicon germanium, or combinations and multi-layers thereof. BOX 102 acts as an insulting layer formed over substrate 101. Wide-bandgap III-V semiconductor 103 is a thin layer, for example, from 3 nm to 10 nm in thickness, and is used as the seed for the epitaxy of the compositionally-graded nanowire channel shell. Wide-bandgap III-V semiconductor 103 is composed of column III and V elements and may be, for example, indium phosphide (InP), gallium arsenide (GaAs), aluminum gallium arsenide (AlGaAs), or indium aluminum arsenide (InAlAs). In this exemplary embodiment, wide-bandgap III-V semiconductor 103 is composed of a starting material of InP or InAlAs. In other embodiments of the present invention, silicon-on-insulator or germanium-on-insulator (i.e., SOI or GeOI) substrates may be used as a starting wafer.

Figure 2A:
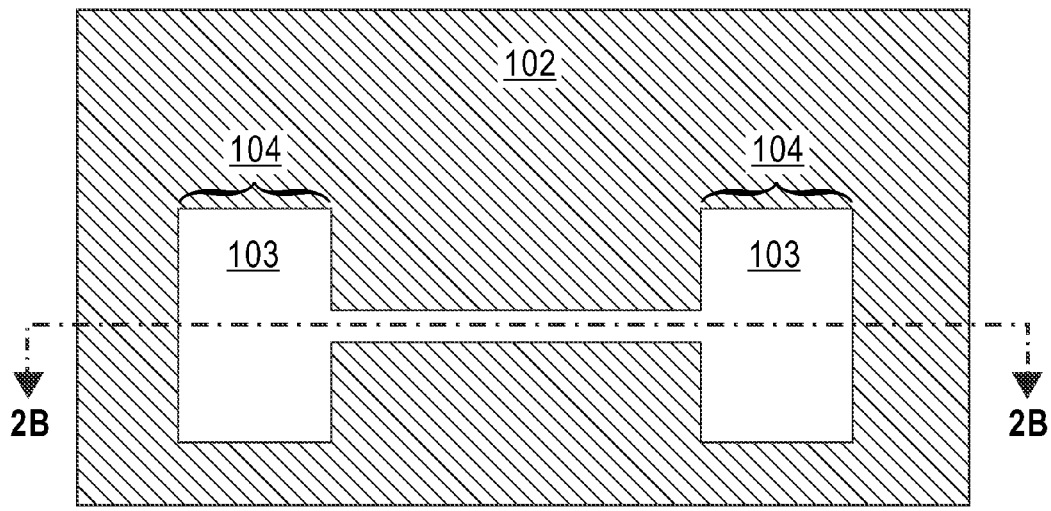
FIGS. 2A and 2B depict a plan view and a cross-sectional view of the semiconductor starting wafer of FIGS. 1A and 1B after the nanowire region is defined by anchor pads, in accordance with an embodiment of the present invention.
Figure 2B:
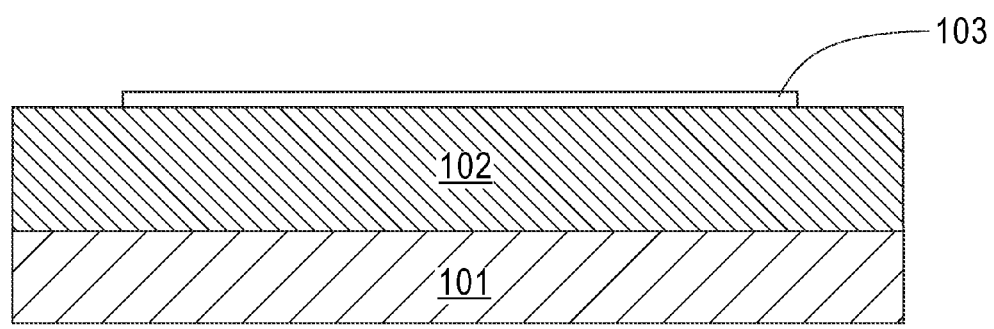

Referring now to FIGS. 2A and 2B, FIG. 2A depicts a plan view of the semiconductor starting wafer 100 of FIGS. 1A and 1B after the nanowire region is defined by anchor pads 104, and FIG. 2B depicts a cross-sectional view of FIG. 2A, taken along the line 2B-2B of FIG. 2A. As depicted in FIGS. 2A and 2B, lithography techniques are used to define the nanowire region with anchor pads 104. The position of anchor pads 104 is shown in a plan view of the semiconductor in FIG. 2A. In this exemplary embodiment, a photolithography process known in the art is used, and the nanowire region containing anchor pads 104 is covered with a photoresist (PR). Wide-bandgap III-V semiconductor 103 is then etched out from regions not covered with the photoresist by any etch processes known in the art, such as reactive ion etching (RIE), as depicted in FIGS. 2A and 2B. The etching process is typically chosen so the etching chemistry is selective with respect to wide-bandgap III-V semiconductor 103.

Figure 3A:
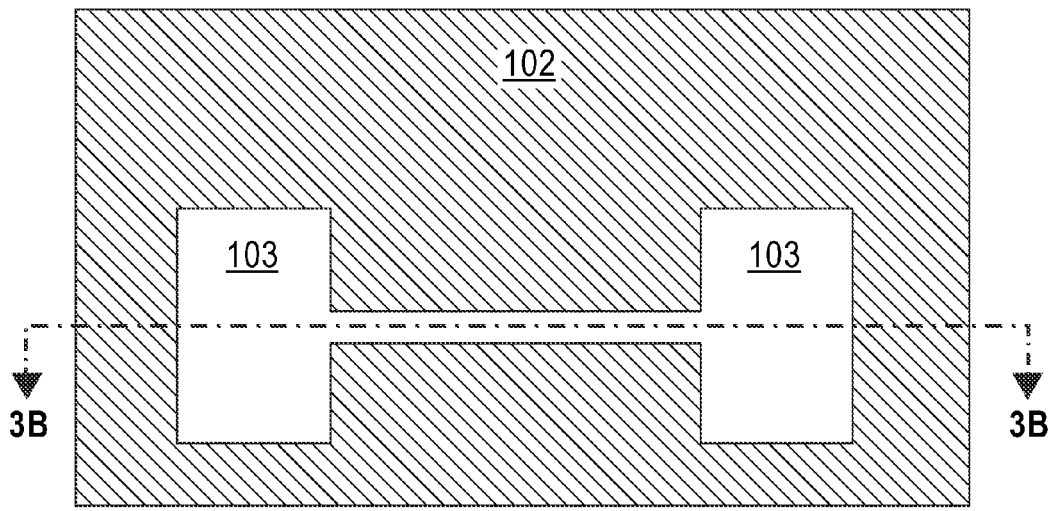
FIGS. 3A and 3B depict a plan view and a cross-sectional view of the semiconductor after the etching of a recess below the nanowire, in accordance with an embodiment of the present invention.
Figure 3B:
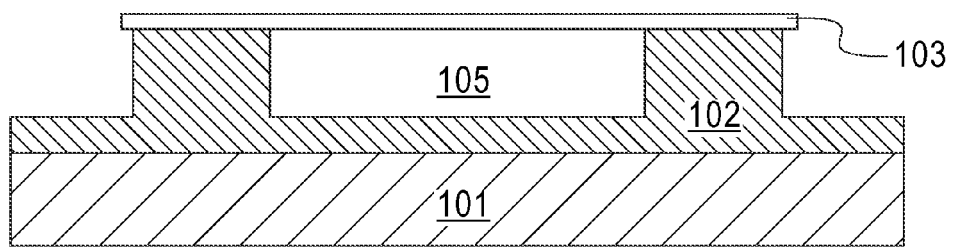

Referring now to FIGS. 3A and 3B, FIG. 3A depicts a plan view of the semiconductor after the etching of recess 105 below the nanowire, and FIG. 3B depicts a cross-sectional view of FIG. 3A, take along the line 3B-3B of FIG. 3A. In this exemplary embodiment, the insulating layer, BOX 102, is etched out to form recess 105 below the nanowire, using an isotropic etching process known in the art. For example, diluted hydrofluoric acid (DHF) can be used to undercut BOX 102 under the nanowire. In this exemplary embodiment, BOX 102 is only etched out in the region below the nanowire which is not covered by anchor pads 104. Anchor pads 104 are much larger than the nanowire width, thus the oxide recess yields a nanowire that is suspended between anchor pads 104.

Figure 4A:
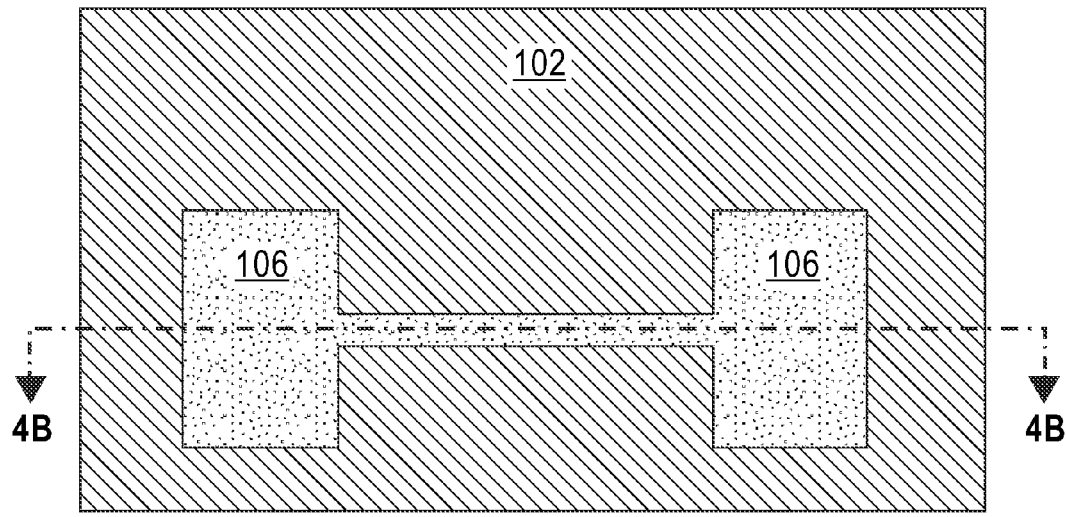
FIGS. 4A and 4B depict a plan view and a cross-sectional view of the semiconductor after the formation of a compositionally-graded channel shell, in accordance with an embodiment of the present invention.
Figure 4B:
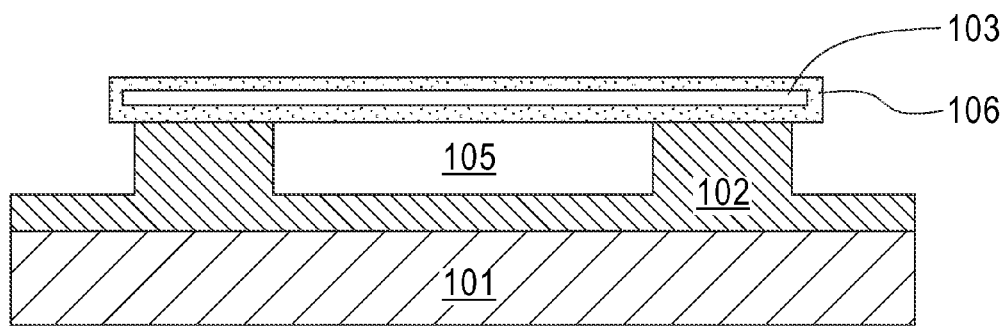

Referring now to FIGS. 4A and 4B, FIG. 4A depicts a plan view of the semiconductor after the formation of compositionally-graded channel shell 106, and FIG. 4B depicts a cross-sectional view of FIG. 4A, taken along the line 4B-4B of FIG. 4A. Compositionally-graded channel shell 106 is formed using selective epitaxial growth processes, such as metal-organic chemical vapor deposition (MOCVD) or atomic layer deposition (ALD), and may have a thickness of approximately 5 nm to 20 nm. After the growth of compositionally-graded channel shell 106, wide-bandgap III-V semiconductor 103 acts like a core and, therefore, is also referred to as a wide-bandgap core (hereinafter referred to as "wide-bandgap core 103"). The grading of the channel shell creates a built-in field on the semiconductor. In this exemplary embodiment, wide-bandgap core 103 is composed of GaAs, and compositionally-graded channel shell 106 material starts as $In_{0.2}Ga_{0.8}As$ closest to wide-bandgap core 103, where the In content in the ternary alloy is 20% and the Ga content is 80%. As the distance from wide-bandgap core 103 increases, the percentage of In content then increases to 53%, while the Ga content decreases to 47% and, at an even farther distance from wide-bandgap core 103, the In content increases further to 72%, while the Ga content drops further to 28%. In yet another embodiment, wide-bandgap core 103 is composed of aluminum arsenide (AlAs) and compositionally-graded channel shell 106 material starts as $Al_xGa_{1-x}As$ with x=1, which is then graded all the way to GaAs, where x=0, at the outer surface of compositionally-graded channel shell 106. The grading profile (i.e., the change of composition 'x' in the radial direction) can be linear, or take other mathematical forms.

Figure 5A:
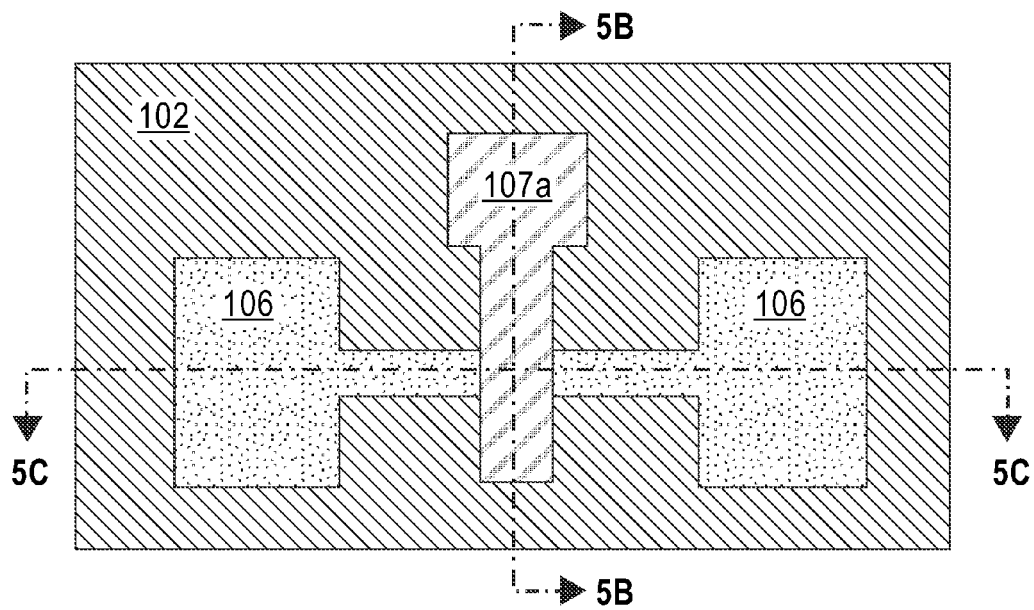
FIGS. 5A-5C depict a plan view and cross-sectional views of the semiconductor after the formation of a gate structure, in accordance with an embodiment of the present invention.
Figure 5B:
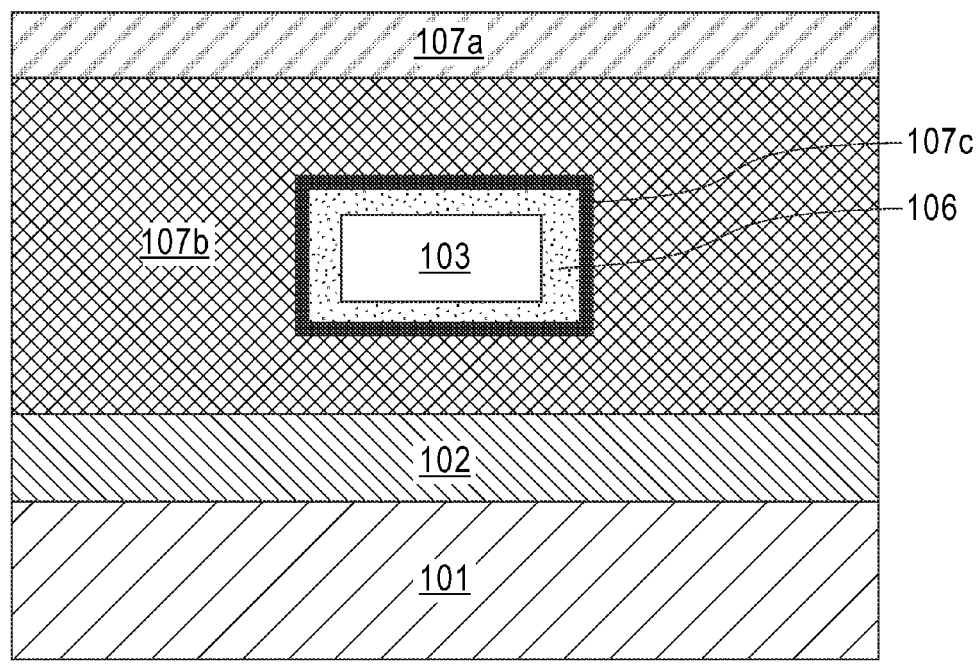
Figure 5C:
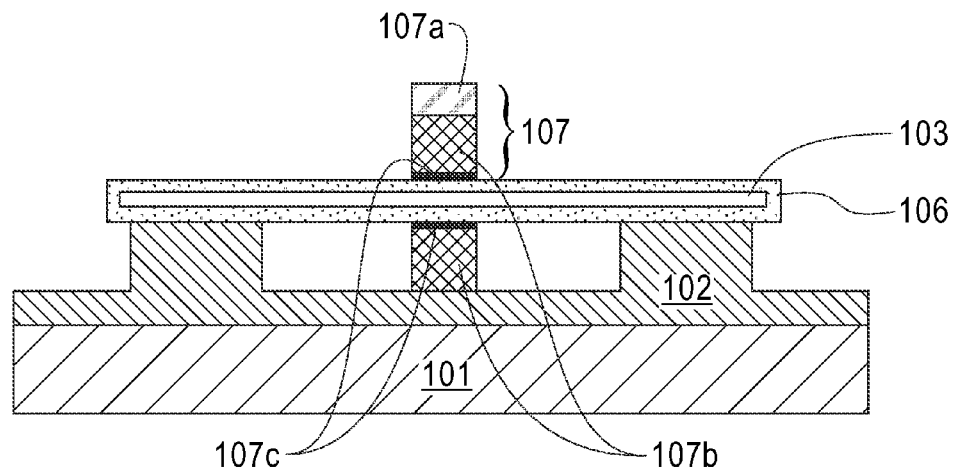

Referring now to FIGS. 5A-5C, FIG. 5A depicts a plan view of the semiconductor after the formation of gate-allaround structure 107, FIG. 5B depicts a cross-sectional view of FIG. 5B, taken along the line 5B-5B of FIG. 5A, and FIG. 5C depicts a cross-sectional view of FIG. 5A, taken along the line 5C-5C. As depicted in FIG. 5C, gate-all-around structure 107 includes gate dielectric 107c, gate electrode 107b, and gate hard mask 107a. In a gate-all-around structure, gate dielectric 107c and gate electrode 107b surround the nanowire channel. A conformal gate dielectric 107c is deposited using a suitable deposition technique including, but not limited to, ALD, chemical vapor deposition (CVD), plasma-enhanced chemical vapor deposition (PECVD), or any other conformal deposition process. Gate dielectric 107c may be composed of any appropriate gate dielectric material, including, but not limited to, $SiO_2$, $HfO_2$, $ZrO_2$, $Al_2O_3$, $La_2O_3$, $Y_2O_3$, $LaAlO_3$, $HfSiO_2$, and $SrTiO_3$. Gate electrode 107b is then deposited on gate dielectric 107a. In this exemplary embodiment, the deposition is conformal to fabricate a gate-all-around structure. Gate electrode 107b is deposited by a known deposition method such as CVD, PECVD, ALD, physical vapor deposition (PVD), or other similar known deposition methods. Gate electrode 107b may be composed of any suitable conductive material for a gate electrode, including, but not limited to, Ti, TiN, Ta, TaN, doped poly Si, doped poly SiGe, and doped poly Ge. Finally, gate hard mask 107a is deposited on gate electrode 107b. Gate hard mask 107a is deposited by a known deposition method such as CVD, PECVD, ALD, or other similar known deposition methods. Gate hard mask 107a may be composed of any suitable insulating material including, but not limited to, SiN and $SiO_2$. Gate-all-around structure 107 is then patterned using standard lithography and etching techniques known in the art, such as those described above. As depicted in FIG. 5B, compositionally-graded channel shell 106 encompasses wide-bandgap core 103, and gate-all-around structure 107 (i.e., gate dielectric 107c, gate electrode 107b, and gate hard mask 107a) fully encompasses the core/graded channel structure.

Figure 6A:
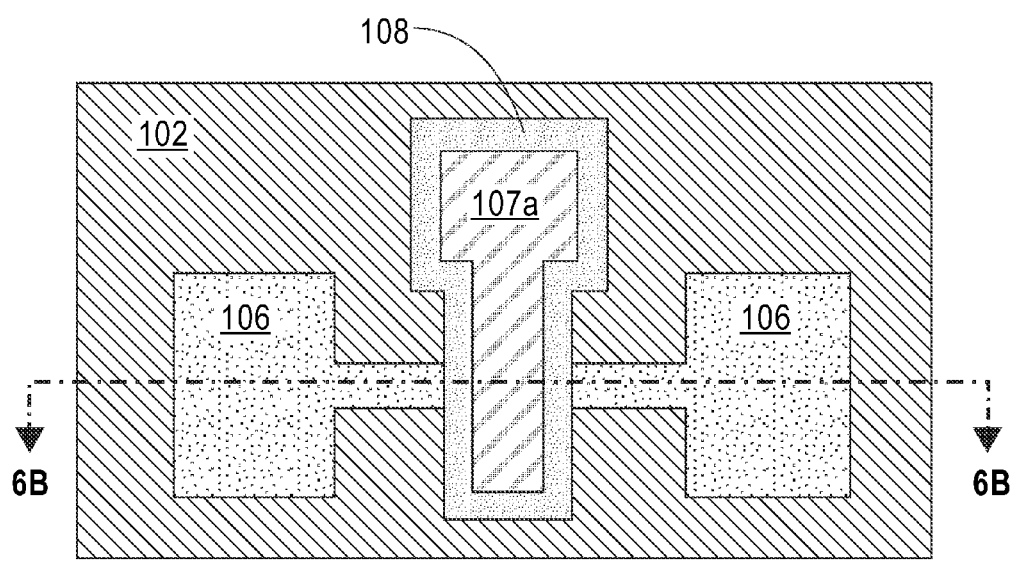
FIGS. 6A and 6B depict a plan view and a cross-sectional view of the semiconductor after the formation of spacers on the sidewalls of the gate structure of FIGS. 5A-5C, in accordance with an embodiment of the present invention.
Figure 6B:
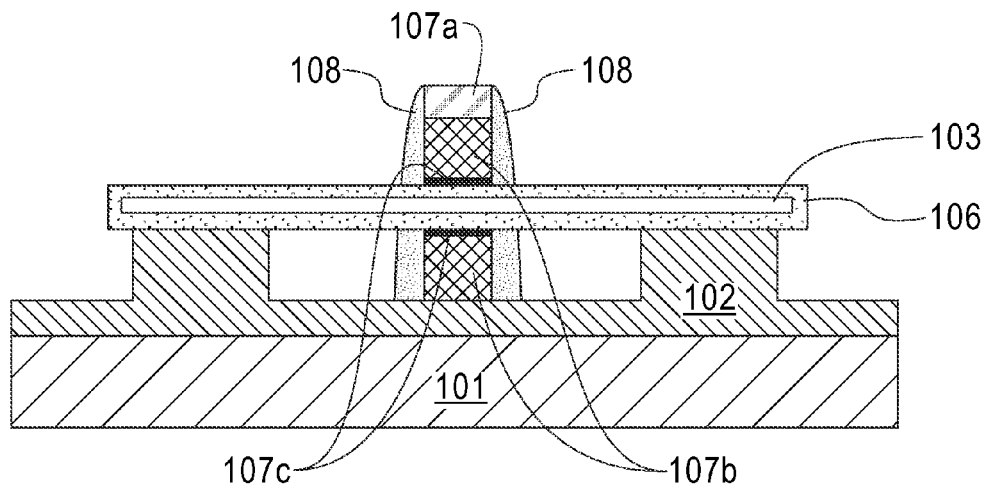

Referring now to FIGS. 6A and 6B, FIG. 6A depicts a plan view of the semiconductor after the formation of spacers 108 on the sidewalls of gate-all-around structure 107 of FIGS. 5A-5C, and FIG. 6B depicts a cross-sectional view of FIG. 6A, taken along the line 6B-6B of FIG. 6A. Spacers 108 may be composed of any dielectric, such as a nitride (e.g., SiN), an oxide (e.g., $SiO_2$), an oxynitride, or a combination thereof. The dielectric material of spacers 108 may be deposited through, for example, chemical vapor deposition (CVD). The dielectric material is then etched using an anisotropic etching process, such as reactive ion etching (RIE), to form spacers 108.

Figure 7A:
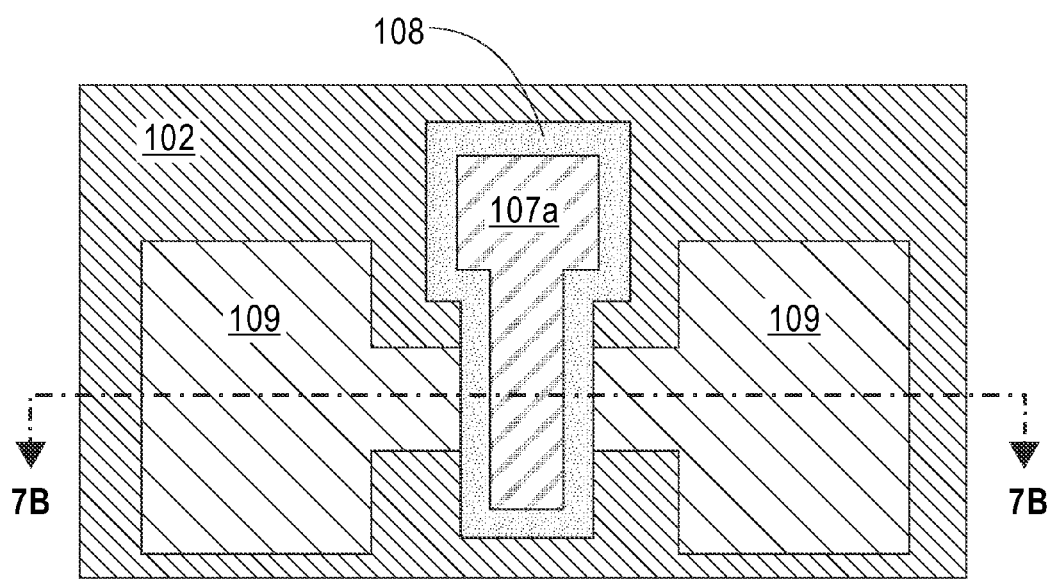
FIGS. 7A and 7B depict a plan view and a cross-sectional view of the semiconductor after the formation of a doped raised source drain region, in accordance with an embodiment of the present invention.
Figure 7B:
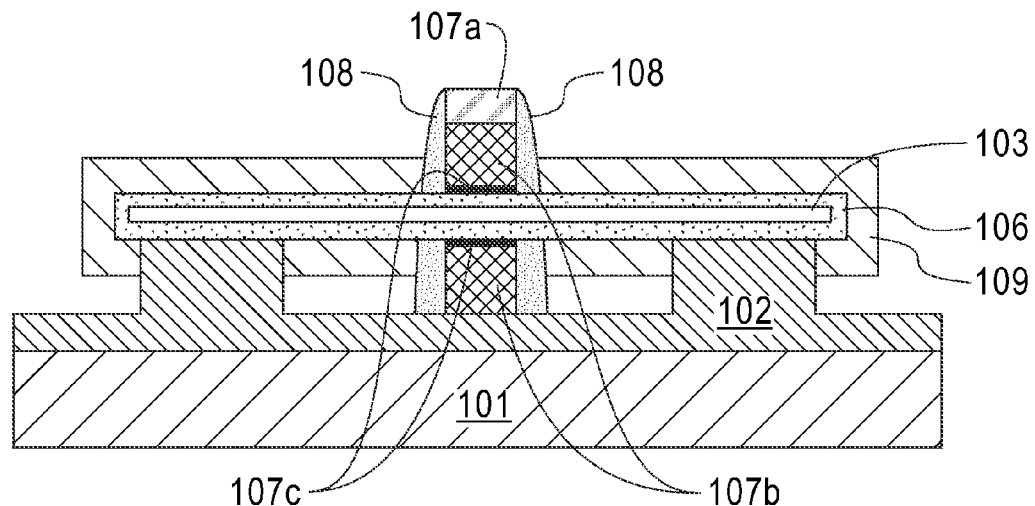

Referring now to FIGS. 7A and 7B, FIG. 7A depicts a plan view of the semiconductor after the formation of doped III-V raised source drain (RSD) region 109, and FIG. 7B depicts a cross-sectional view of FIG. 7A, taken along the line 7B-7B of FIG. 7A. RSD region 109 is formed using selective epitaxial growth processes, such as MOCVD or ALD. In this exemplary embodiment RSD region 109 is doped in-situ (i.e., during the epitaxial growth) with dopant appropriate for the FET type. For example, III-V NFETs are doped with Si, Se, or Te, while III-V PFETs are doped with Zn or C. RSD region 109 facilitates conductivity in the source/drain regions and increases the volume of material that may offer lower series resistance. In some embodiments, RSD region(s) 109 from adjacent nanowires are capable of merging and forming a new anchor pad, where contact vias may be dropped when there is a tight nanowire pitch.

Figure 8:
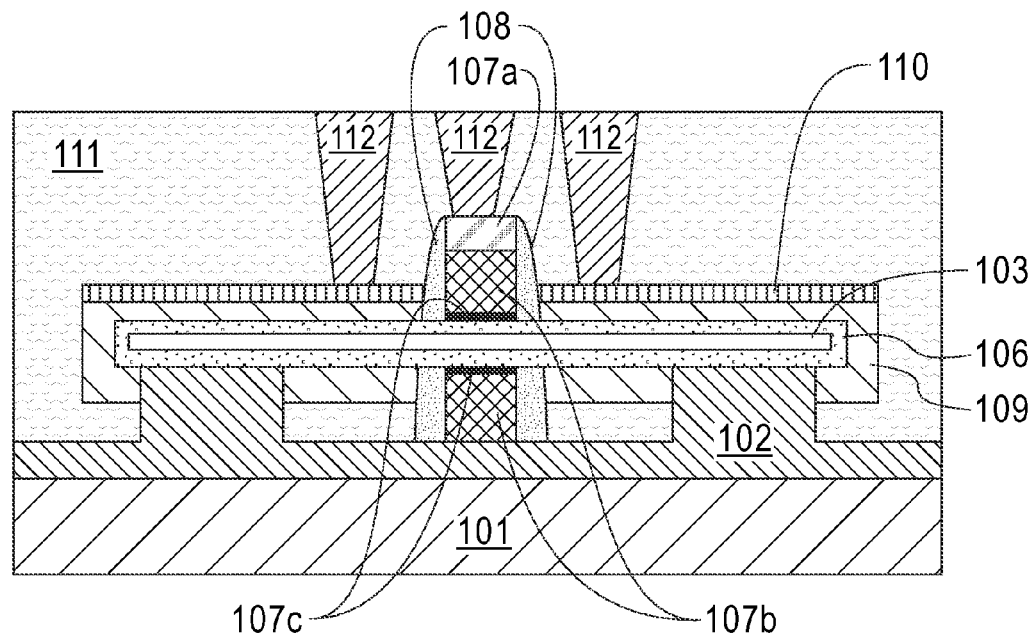
FIG. 8 depicts an example of a cross-sectional view of an FET after semiconductor processing is complete, in accordance with an embodiment of the present invention.

FIG. 8 depicts a cross-sectional view of the FET after the completion of semiconductor processing, in accordance with an embodiment of the present invention. FET processing is completed through the formation of a metal-III-V alloy 110, planarization using interlayer dielectric (ILD) 111, and the formation of contact vias 112, which are standard processes known in the art.

Figure 9A:
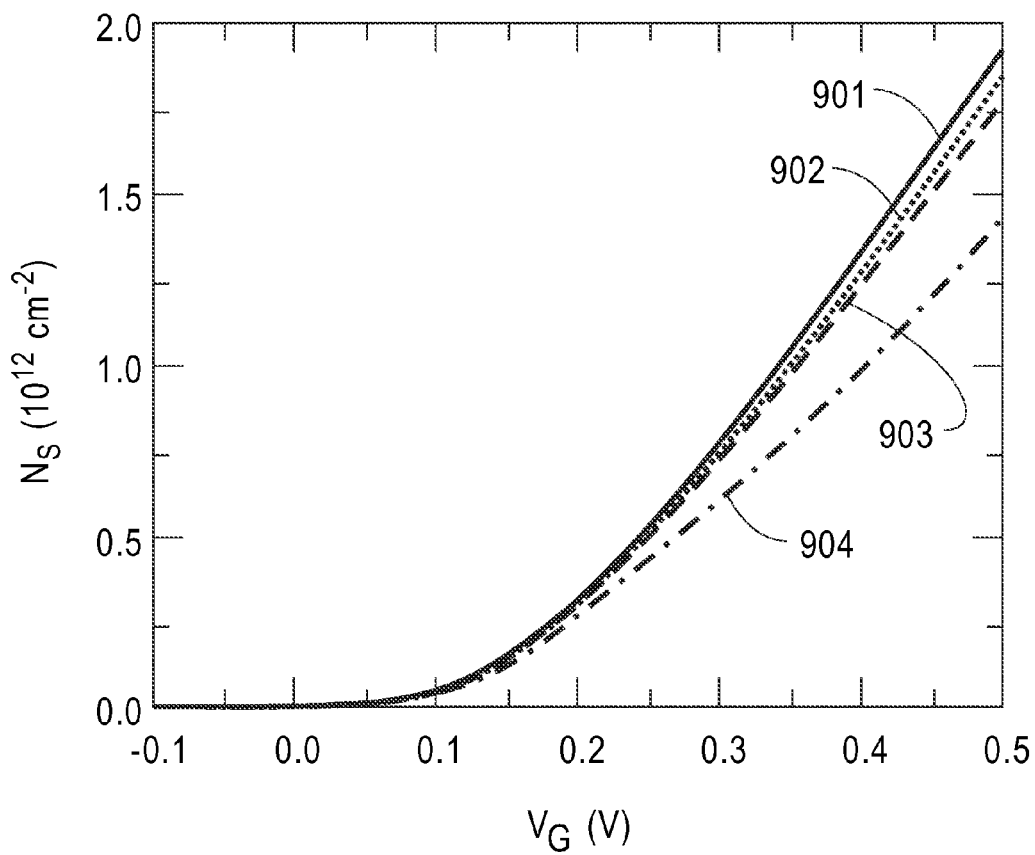
FIG. 9A depicts an example graph of the gate voltage as a function of the sheet carrier charge in the channel for various FET structures, in accordance with an embodiment of the present invention.

FIG. 9A depicts an example graph in which the gate voltage (VG) is plotted as a function of the sheet carrier charge in the channel ($N_s$), for a plurality of FETs (FET 901-904). FET 901 is a 10 nm InGaAs 50% nanowire, with uniform grading throughout. FET 902 is a 10 nm InGaAs nanowire, where 100% is InAs, with uniform grading throughout. FET 903 is a 10 nm InGaAs nanowire with a linear grading from 100% to 50%. FET 904 is a 10 nm InGaAs nanowire with a linear grading from 100% to 50%, and a 3 nm core. As depicted in FIG. 9A, FET 904 has a lower $N_s$ in the inversion regime, due to a larger wave function spread and a smaller density-of-states capacitance CDOS. The graded channel FETs, FET 901 and FET 902 have a higher $N_s$ than the $In_{0.53}Ga_{0.47}As$ channel FET in the inversion regime, because the wave function spread in a graded channel FET is much smaller due to the built-in field created by the grading.

Figure 9B:
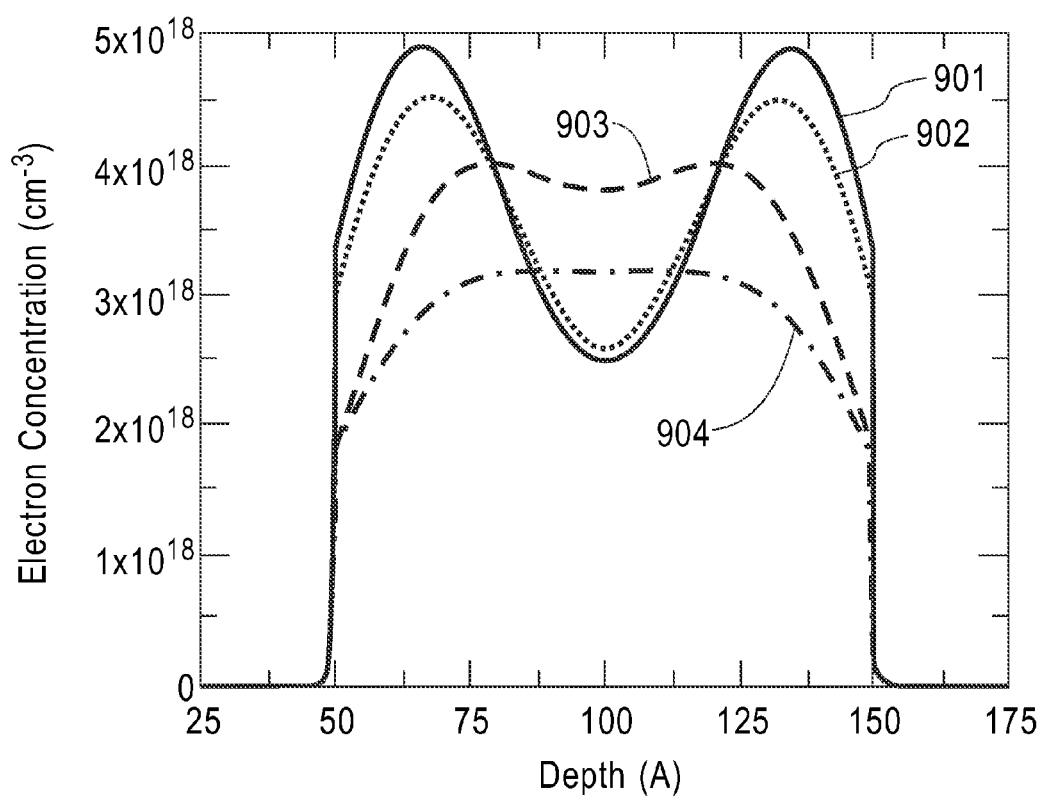
FIG. 9B depicts an example of an electron energy and concentration graph for various FET structures, in accordance with an embodiment of the present invention.

FIG. 9B depicts an example graph in which the depth (A) is plotted as a function of electron concentration (cm-3) for a plurality of FETs (FET 901-904), the composition of which is the same as described above in FIG. 9A. As depicted in FIG. 9B, the gradual change in electron concentration going from one region of the compositionally-graded channel to another region is apparent in the graded FETs (FET 901 and FET 902), while there is relatively little change in electron concentration in the uniform FETs (FET 903 and FET 904). FET 901 and FET 902 show a decrease in electron concentration going toward the wide-bandgap core (i.e., from approximately 50 A to 100 A), with the lowest electron concentration at the center of the wide-bandgap core (i.e., approximately 100 A). Moving away from the core and toward the outer shell of the graded-channel (i.e., from approximately 100 A to 150 A), the electron concentration increases, which correlates with the grading composition as described above with respect to FIG. 4.

Having described embodiments for a III-V nanowire FET with a compositionally-graded channel shell around a wide-bandgap core with reduced short channel effects and methods of fabrication (which are intended to be illustrative and not limiting), it is noted that modifications and variations may be made by persons skilled in the art in light of the above teachings. It is, therefore, to be understood that changes may be made in the particular embodiments disclosed which are within the scope of the invention as outlined by the appended claims.

In certain embodiments, the fabrication steps depicted above may be included on a semiconductor substrate consisting of many devices and one or more wiring levels to form an integrated circuit chip.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications, to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

What is claimed is:

1. A semiconductor structure comprising:
   a wide-bandgap layer disposed on a semiconductor substrate;
   a nanowire FET disposed above said semiconductor substrate, wherein said nanowire FET comprises a compositionally-graded channel shell;
   a gate structure, wherein at least a portion of the gate structure is disposed on said nanowire FET;
   spacers formed on sidewalls of the gate structure; and
   a doped III-V raised source drain region around said compositionally-graded channel shell, wherein a doped III-V raised source drain is configured to facilitate conductivity in the doped III-V raised source drain region.

2. The semiconductor structure of claim 1, wherein the gate structure comprises a gate-all-around structure with a compositionally-graded channel shell.

3. The semiconductor structure of claim 1, wherein the wide-bandgap layer is comprised of column III and V elements.

4. The semiconductor structure of claim 1, wherein the compositionally-graded channel shell comprises a column III element and a column V element.

5. The semiconductor structure of claim 4, wherein the compositionally-graded channel shell comprising column III and column V elements comprises a material composition of $In_{0.2}Ga_{0.8}As$ that compositionally grades to a material composition of $In_{0.72}Ga_{0.28}As$, wherein the material composition of $In_{0.2}Ga_{0.8}As$ is disposed farther from a gate electrode than the material composition of $In_{0.72}Ga_{0.28}As$.

6. The semiconductor structure of claim 1, wherein the gate structure comprises a gate dielectric, a gate electrode, and a gate hard mask.

7. The semiconductor structure of claim 1, wherein the wide-bandgap layer has a thickness that is greater than or equal to 3 nm and less than or equal to 10 nm.

8. The semiconductor structure of claim 1, wherein the compositionally-graded channel shell has a thickness that is greater than or equal to 5 nm and less than or equal to 20 nm.

9. The semiconductor structure of claim 1, wherein the semiconductor substrate comprises silicon-on-insulator (SOI) or germanium-on-insulator (GeoI) on buried oxide (BOX).

10. The semiconductor structure of claim 1, wherein said wide-bandgap layer comprises a starting material composition of InP.

11. The semiconductor structure of claim 1, wherein said wide-bandgap layer comprises a starting material composition of InAlAs.

* * * * *